(12) United States Patent
Xu et al.

(10) Patent No.: US 10,535,527 B2
(45) Date of Patent: Jan. 14, 2020

(54) METHODS FOR DEPOSITING SEMICONDUCTOR FILMS

(71) Applicant: APPLIED MATERIALS, INC., Santa Clara, CA (US)

(72) Inventors: Yi Xu, San Jose, CA (US); Takashi Kuratomi, San Jose, CA (US); Avgerinos V. Gelatos, Scotts Valley, CA (US); Vikash Banthia, Los Altos, CA (US); Mei Chang, Saratoga, CA (US); Kazuya Daito, Milipitas, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 4 days.

(21) Appl. No.: 16/028,855

(22) Filed: Jul. 6, 2018

(65) Prior Publication Data

US 2019/0019684 A1    Jan. 17, 2019

Related U.S. Application Data

(60) Provisional application No. 62/532,335, filed on Jul. 13, 2017.

(51) Int. Cl.
*H01L 21/285* (2006.01)
*C23C 16/455* (2006.01)
*C23C 16/42* (2006.01)

(52) U.S. Cl.
CPC ........ *H01L 21/28518* (2013.01); *C23C 16/42* (2013.01); *C23C 16/455* (2013.01); *C23C 16/4554* (2013.01); *C23C 16/45523* (2013.01); *C23C 16/45527* (2013.01); *C23C 16/45529* (2013.01); *C23C 16/45536* (2013.01); *C23C 16/45538* (2013.01); *H01L 21/28556* (2013.01)

(58) Field of Classification Search
CPC ......... H01L 21/28518; H01L 21/28556; C23C 16/455; C23C 16/45523; C23C 16/45527; C23C 16/45529; C23C 16/45536; C23C 16/42; C23C 16/56
See application file for complete search history.

(56) References Cited

U.S. PATENT DOCUMENTS

| 5,856,237 A | 1/1999 | Ku |
| 6,451,388 B1 | 9/2002 | Tada et al. |
| 6,841,203 B2 | 1/2005 | Tada et al. |
| 7,122,474 B2 | 10/2006 | Lee |
| 7,484,513 B2 | 2/2009 | Tada et al. |
| 9,257,278 B2 | 2/2016 | Yamasaki et al. |

(Continued)

OTHER PUBLICATIONS

International Search Report and Written Opinion dated Oct. 31, 2018 for PCT Application No. PCT/US2018/041379.

*Primary Examiner* — Thanhha S Pham
(74) *Attorney, Agent, or Firm* — Moser Taboada (57) ABSTRACT

A method for forming a film on a substrate in a semiconductor process chamber includes forming a first layer on the substrate using a plasma enhanced process and a gas compound of a chloride-based gas, a hydrogen gas, and an inert gas. The process chamber is then purged and the first layer is thermally soaked with a hydrogen-based precursor gas. The process chamber is then purged again and the process may be repeated with or without the plasma enhanced process until a certain film thickness is achieved on the substrate.

17 Claims, 4 Drawing Sheets

(56) References Cited

U.S. PATENT DOCUMENTS

| | | |
|---|---|---|
| 2003/0143841 A1 | 7/2003 | Yang et al. |
| 2004/0127027 A1 | 7/2004 | Lee et al. |
| 2009/0146306 A1* | 6/2009 | Lee .................. H01L 21/28518 257/754 |
| 2011/0237076 A1 | 9/2011 | Narushima |

* cited by examiner

METHODS FOR DEPOSITING SEMICONDUCTOR FILMS

CROSS-REFERENCE TO RELATED APPLICATIONS

This application claims benefit of U.S. provisional patent application Ser. No. 62/532,335, filed Jul. 13, 2017, which is herein incorporated by reference in its entirety.

FIELD

Embodiments of the present principles generally relate to semiconductor processes used in semiconductor manufacturing.

BACKGROUND

Silicon substrates used for semiconductor manufacturing often have a silicon oxide that forms on surfaces during processing, greatly increasing the resistivity of any contacts formed on the substrate. A reactive silicide can be used to interact with the silicon oxide to form a better contact region. Aluminum, often used as a contact, adversely reacts with the silicide and underlying silicon, causing junction failures. However, titanium silicide was found to produce a superior contact region while enabling a titanium nitride barrier layer to be used, reducing the silicon adsorption issues with aluminum.

For these reasons, titanium silicide is often used to form ohmic contacts and to reduce contact resistance of local transistor connections. During the formation of a titanium silicide layer on a substrate, silicon is often consumed from the substrate causing a reduction in silicon material and a low silicon to silicon oxide selectivity ratio in the substrate. Generally, high temperatures (e.g. 700 degrees Celsius) are often used during the titanium silicide deposition process.

Accordingly, the inventors have developed an improved process for depositing titanium silicide and other types of films on substrates.

SUMMARY

Methods and apparatus for forming an enhanced film on a substrate in a semiconductor process chamber.

In some embodiments, a method for forming a film on a substrate comprises depositing a film on the substrate with a process temperature of less than 500 degrees Celsius by forming a first layer on the substrate using a plasma enhanced process and a gas compound of a chloride-based gas, a hydrogen gas, and an inert gas and thermally soaking the first layer with at least a hydrogen-based precursor gas. In some embodiments, the method further comprises forming a second layer on the first layer without using the plasma enhanced process and using a gas compound of a chloride-based gas, a hydrogen gas, and an inert gas and thermally soaking the second layer with at least a hydrogen-based precursor gas.

In some embodiments, the method further comprises forming a second layer on the first layer without using the plasma enhanced process and using a gas compound of a chloride-based gas, a hydrogen gas, and an inert gas; and thermally soaking the second layer with at least a hydrogen-based precursor gas; forming a second layer on the first layer using the plasma enhanced process and a gas compound of a chloride-based gas, a hydrogen gas, and an inert gas and thermally soaking the second layer with at least a hydrogen-based precursor gas; powering the plasma enhanced process with less than approximately 0.283 watts/cm$^2$; powering the plasma enhanced process with less than approximately 0.141 watts/cm$^2$; thermally soaking with the at least a hydrogen-based precursor gas for a time duration of approximately 100 milliseconds to approximately 10 seconds; wherein the inert gas is argon; wherein the plasma enhanced process is one of a plasma enhanced atomic layer deposition process and a plasma enhanced chemical vapor deposition process; depositing the film at a pressure of approximately 1 mTorr to approximately 100 Torr; wherein the depositing of the film occurs at a pressure of approximately 50 Torr; and/or repeating the depositing of the film until a certain thickness is achieved on the substrate.

In some embodiments, a method for forming a film on a substrate in a semiconductor process chamber comprises depositing a film on the substrate by forming a first layer on the substrate using a plasma enhanced process and a gas compound of a chloride-based gas, a hydrogen gas, and an inert gas, purging gases from the semiconductor process chamber, thermally soaking the first layer with at least a hydrogen-based precursor gas for a time duration of approximately 100 milliseconds to approximately 10 seconds, purging gases from the semiconductor process chamber, and repeating the depositing of the film until a certain thickness is achieved on the substrate. In some embodiments, the method further comprises forming a second layer on the first layer without using the plasma enhanced process and using a gas compound of a chloride-based gas, a hydrogen gas, and an inert gas and thermally soaking the second layer with at least a hydrogen-based precursor gas.

In some embodiments, the method further comprises forming a second layer on the first layer using a gas compound of a chloride-based gas, a hydrogen gas, and an inert gas, the second layer formed without the plasma enhanced process; and thermally soaking the second layer with at least a hydrogen-based precursor gas; powering the plasma enhanced process with less than approximately 0.283 watts/cm$^2$; powering the plasma enhanced process with less than approximately 0.141 watts/cm$^2$; thermally soaking with at least a hydrogen-based precursor gas for a time duration of approximately 100 milliseconds to approximately 10 seconds; wherein the plasma enhanced process is one of a plasma enhanced atomic layer deposition process and a plasma enhanced chemical vapor deposition process; depositing the film at a pressure of approximately 1 mTorr to approximately 100 Torr; and/or wherein the depositing of the film occurs at a pressure of approximately 50 Torr.

In some embodiments, a method for forming a film on a substrate in a semiconductor process chamber comprises depositing a film on the substrate by forming a first layer on the substrate using a plasma enhanced process with a power density of less than approximately 0.283 watts/cm$^2$ and a gas compound of a chloride-based gas, a hydrogen gas, and an inert gas; purging gases from the semiconductor process chamber; thermally soaking the first layer with at least a hydrogen-based precursor gas; purging gases from the semiconductor process chamber; and forming a subsequent layer on the substrate without using the plasma enhanced process; and thermally soaking the subsequent layer with at least a hydrogen-based precursor gas.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Many different types of films are used during the manufacturing process of semiconductor devices. The efficiencies of the processes impact not only the cost of the final semiconductor product but also the process time, the thermal budgets, and the amount of materials consumed. Some embodiments of the methods and apparatus of the present principles can be used to manufacture films containing transition metals and other species such as germanium, phosphorus, boron, etc. used, for example, in in situ doping. For brevity's sake, the specific examples of some embodiments will be discussed below based on silicon containing species. However, the methods and apparatus are not limited to silicon containing species. The methods may also be performed at less than 500 degrees Celsius, advantageously reducing the thermal budget of the substrate. The methods may also be performed with less than 200 watts of RF power for film deposition using a plasma enhanced process on a 300 mm wafer or less than 0.283 watts/cm$^2$, advantageously reducing operating costs of the process. The methods also advantageously achieve a lower chloride impurity level.

In some semiconductor processes, titanium silicide (TiSi$_x$, where x≤3) is used, for example, to produce ohmic contacts and to reduce contact resistance. Titanium chloride based gases (TiCl$_x$, where x≤4) are used in the deposition process to form TiSi$_x$ on a silicon wafer. The TiCl$_x$ interacts with the silicon in the substrate to form TiSi$_x$. The interaction consumes some of the surface silicon of the substrate during the process which decreases the amount (e.g. thickness) of deposited titanium silicide on the silicon compared to the amount of deposited titanium silicide on the silicon oxide. The differences in the amount of deposited TiSi$_x$ on silicon versus the amount of deposited TiSi$_x$ on silicon oxide can be referred to as a selectivity ratio of silicon to silicon oxide (Si:SiO$_2$) (for the deposition of TiSi$_x$). The higher deposition rate on silicon versus silicon oxide advantageously results in high selectivity ratios. Conventional processes often have low selectivity ratios of less than 3:1. In some embodiments, the methods of the present principles advantageously yield a selectivity ratio of greater than approximately 5:1. In some embodiments, the methods beneficially preserve the silicon in the substrate during the deposition while producing a high quality TiSi$_x$ film on the substrate. In some embodiments, other transition metal halides (besides TiCl$_x$) can be used with other transition metals (besides Ti) such as tantalum and tantalum chloride (TaCl$_4$) and the like.

Figure 1:
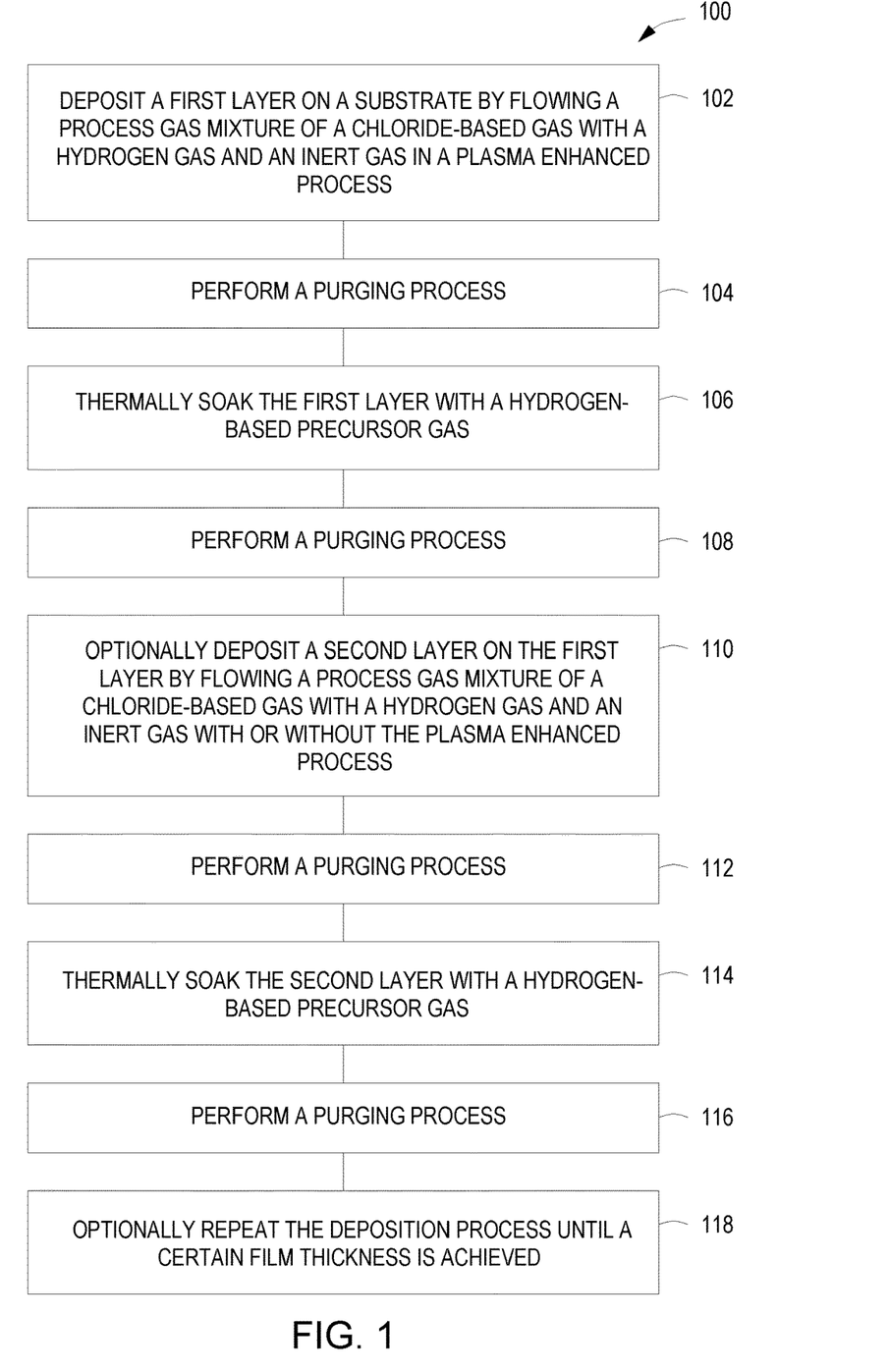
FIG. 1 depicts a flow chart of a method for depositing a film on a substrate in accordance with some embodiments of the present principles.
Figure 2A:
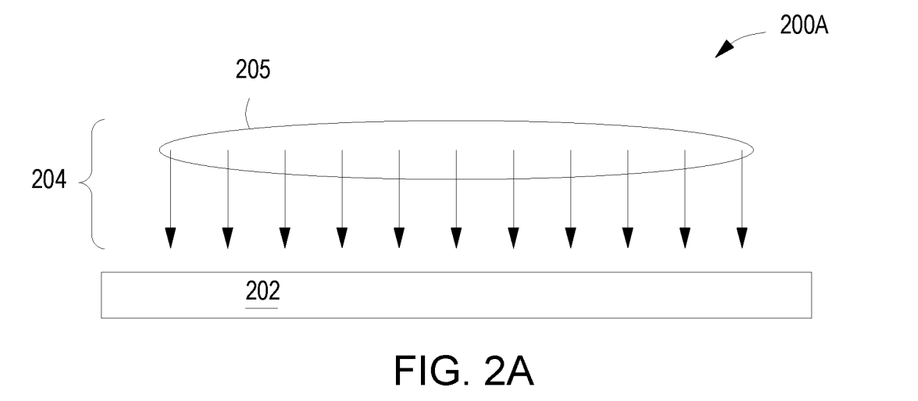
FIGS. 2A-F depict a deposition of a film on a substrate in accordance with some embodiments of the present principles.

In the TiSi$_x$ example, the TiSi$_x$ film is formed using a sequential TiCl$_x$ (H$_2$) plasma enhanced deposition and silicon-based precursor thermal soak (e.g., silane (SiH$_4$) or other silicon based gases). In some embodiments utilizing, for example, other transition metals, other transition metal halides may be used in place of the TiCl$_x$. In some embodiments utilizing germanium-based, phosphorus-based, or boron-based or other doped films, for example, a non-silicon-based precursor thermal soak may be used which may include, for example, germane (GeH$_4$), phosphane (PH$_3$), and/or diborane (B$_2$H$_6$). In some embodiments, a non-silicon based precursor may include halides such as, for example, boron trichloride (BCl$_3$), phosphorus trichloride (PCl$_3$), various chlorosilanes, and various chlorogermanes and the like. FIG. 1 depicts a flow chart of a method 100 for depositing a film, such as, for example, titanium silicide (TiSi$_x$) on a substrate in accordance with some embodiments of the present principles. A first layer 206 (FIG. 2B) (for example, titanium silicide (TiSi$_x$)) is deposited on a substrate 202, such as, for example, a silicon substrate used in forming a TiSi$_x$ film, by flowing a process gas mixture 204 of a chloride-based gas (such as, for example, titanium chloride (TiCl$_x$) for TiSi$_x$ film) with a hydrogen gas (H$_2$) and an inert gas in a plasma enhanced process (flow chart block 102) as illustrated in FIG. 2A. In some embodiments, the inert gas is argon. The process gas mixture 204 and the inert gas may be premixed before flowing or mixed during flowing (e.g., gases separated until entering a processing chamber).

The plasma enhanced process may include a plasma enhanced chemical vapor deposition process or a plasma enhanced atomic layer deposition process. The plasma enhanced deposition process and the thermal soak are performed at a temperature of less than 500 degrees Celsius. In some embodiments, the temperature may be approximately 300 degrees Celsius for the deposition and thermal soak. The temperature in some embodiments may be maintained during the duration of method 100. By maintaining the processes at a low temperature, the efficiency of the method 100 is increased. By having the processes at an approximately common temperature, the processes may be advantageously performed in a single processing chamber, beneficially increasing manufacturing throughput and reducing processing costs.

In some embodiments, the radio frequency (RF) power supplied for the plasma enhanced process may be less than 0.283 watts/cm$^2$. In other embodiments, the power supplied during the plasma enhanced process may be less than 0.141 watts/cm$^2$. Better selectivity may be achieved at lower power levels. Lower power levels also contribute to a more efficient process. In some embodiments, RF energy supplied may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided to provide RF energy in a plurality of the above frequencies.

The method 100 may be performed, in some embodiments, at a pressure of approximately 1 mTorr to approximately 100 Torr during the film deposition and thermal soak. In other embodiments, the method 100 is performed at a pressure of approximately 50 Torr during the film deposition and thermal soak. During evacuation or purging, the pressure may reach zero or a negative pressure (vacuum) in some embodiments.

Figure 2B:
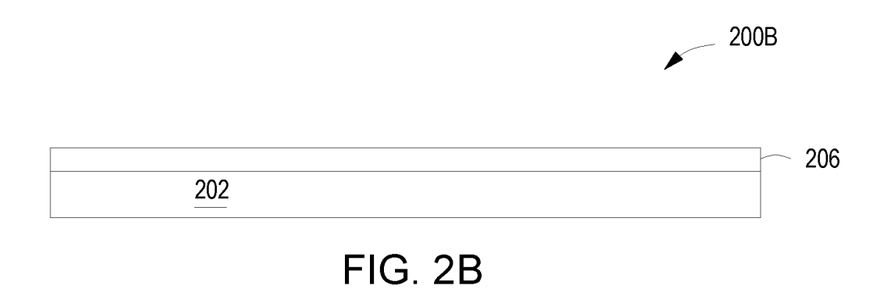

FIG. 2A depicts a cross-sectional view 200A of a substrate 202 with the process gas mixture 204 being flowed to deposit the first layer 206 (FIG. 2B). RF power is used to form a plasma 205 from the process gas mixture 204 which interacts with the substrate 202 to form the first layer 206 as shown in a cross-sectional view 200B of FIG. 2B. The TiCl$_x$ gas molecule bonds are broken down by the plasma 205. The Ti molecules from the broken TiCl$_x$ gas molecules are more easily adsorbed at lower temperatures by, for example, the Si molecules in the substrate 202, consuming the Si from the substrate 202. The reaction causes a lowering of the selectivity ratio of Si:SiO$_2$ of the deposited TiSi$_x$ film.

Some of the molecules from the reaction may not be adsorbed. A purging process is performed to remove any non-adsorbed molecules from the substrate 202 along with any remaining gases (flow chart block 104 of FIG. 1). The purging process may include flowing inert gas over the substrate 202 and/or pumping away any gases in proximity of the substrate 202. A hydrogen-based precursor 208 is then flowed over the substrate 202 to thermally soak the first layer 206 (flow chart block 106 of FIG. 1) as illustrated in a cross-sectional view 200C of FIG. 2C. In some embodiments, the hydrogen-based precursor 208 may include silane (SiH$_4$), germane (GeH$_4$), phosphane (PH$_3$), and/or diborane (B$_2$H$_6$) and/or other precursors. For example, a germanium substrate may use germane as the hydrogen-based precursor, a phosphorus substrate may use phosphane as the hydrogen-based precursor, and a boron substrate may use diborane as the hydrogen-based precursor.

Figure 2C:
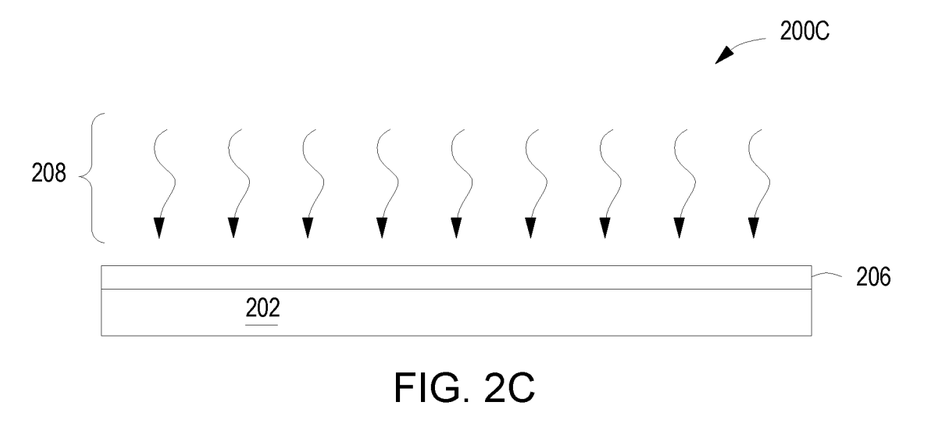

In some embodiments, the thermal soaking may have a time duration of approximately 100 milliseconds to approximately 10 seconds. In the TiSi$_x$ example, silicon molecules, for example from silane (SiH$_4$), are adsorbed into the first layer 206 to replenish Si that was consumed during the plasma enhanced deposition process. The thermal soaking increases the growth, resistivity, and crystallinity of the first layer 206 and, if the process is silicon-based with a silicon substrate, the Si selectivity ratio of the substrate 202. The longer the time duration of the thermal soaking, the more growth, resistivity, and crystallinity are impacted. The thermal soaking with the hydrogen-based precursor 208 also lowers the chloride impurities when compared to not using the hydrogen-based precursor 208. The hydrogen-based precursor 208 may also be co-flowed with an inert gas or may be co-flowed with an inert gas and a hydrogen (H$_2$) gas. In some embodiments, the inert gas may be argon.

After thermally soaking the first layer 206, a purging process is performed to remove the hydrogen-based precursor 208 and/or any non-adsorbed molecules from the substrate 202 (flow chart block 108 of FIG. 1). The purging process may include flowing inert gas over the substrate 202 and/or pumping away any gases in proximity of the substrate 202. A second layer 212, as depicted in a cross-sectional view 200E of FIG. 2E, can be optionally deposited on the first layer 206 by flowing a process gas mixture 210 of a chloride-based gas with a hydrogen gas (H$_2$) and an inert gas with or without a plasma enhanced process (flow chart block 110) as shown in a cross-sectional view 200D of FIG. 2D. For some embodiments using the plasma enhanced process, the plasma enhanced process has been described above with regard to flow chart block 102.

Figure 2D:
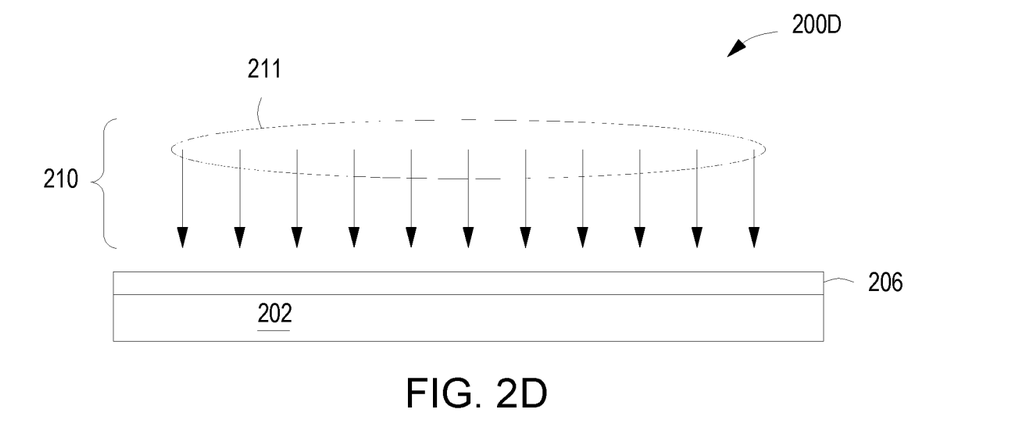
Figure 2E:
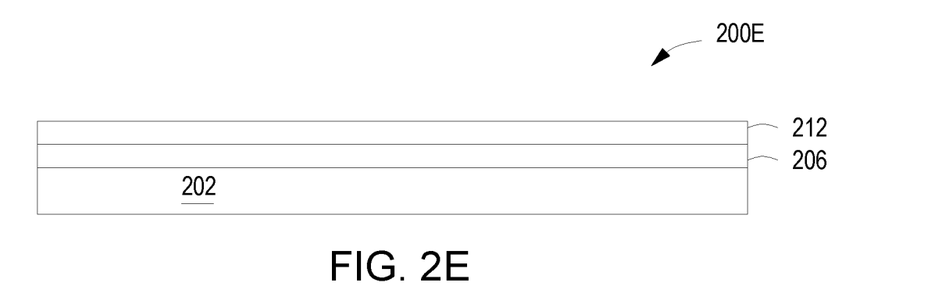

The plasma 211 is illustrated in FIG. 2D by dashed lines to show that forming the plasma 211 is optional. In some embodiments without the plasma enhanced process, the process gas mixture 210 is flowed over the substrate 202 without the molecular bond weakening effect afforded by the plasma. Although the bonds are not weakened by plasma, the process gas mixture 210 is adsorbed by the first layer and the substrate 202. Without the use of plasma 211, the second layer 212 will have different film properties than the first layer 206. With or without the plasma enhanced process, a film is formed on the substrate while further enhancing the selectivity ratio of a deposited film.

A purging process is then performed to remove any non-adsorbed molecules from the substrate 202 along with any gases (flow chart block 112 of FIG. 1). The purging process may include flowing inert gas over the substrate 202 and/or pumping away any gases in proximity of the substrate 202. A hydrogen-based precursor 214 is then flowed over the substrate 202 to thermally soak the second layer 212 (flow chart block 114 of FIG. 1) as illustrated in a cross-sectional view 200F of FIG. 2F. In some embodiments, the hydrogen-based precursor 214 used for the second layer 212 and the hydrogen-based precursor 208 used for the first layer 206 may be different gases or different mixtures of gases. In some embodiments, the hydrogen-based precursor 214 may include silane (SiH$_4$) or other silicon derived gases, germane (GeH$_4$) or other germanium derived gases, phosphane (PH$_3$) or other phosphorus derived gases, and/or diborane (B$_2$H$_6$) or other boron derived gases and/or other precursors. In some embodiments, the hydrogen-based precursor 214 may be used to perform in situ doping by using B$_2$H$_6$ or PH$_3$ with SiH$_4$ to provide a dopant distributed throughout, for example, the TiSi$_x$ films. In some embodiments, arsenic may be used as an n-type dopant. In some embodiments, a gallium dopant may be used in place of a boron dopant.

Figure 2F:
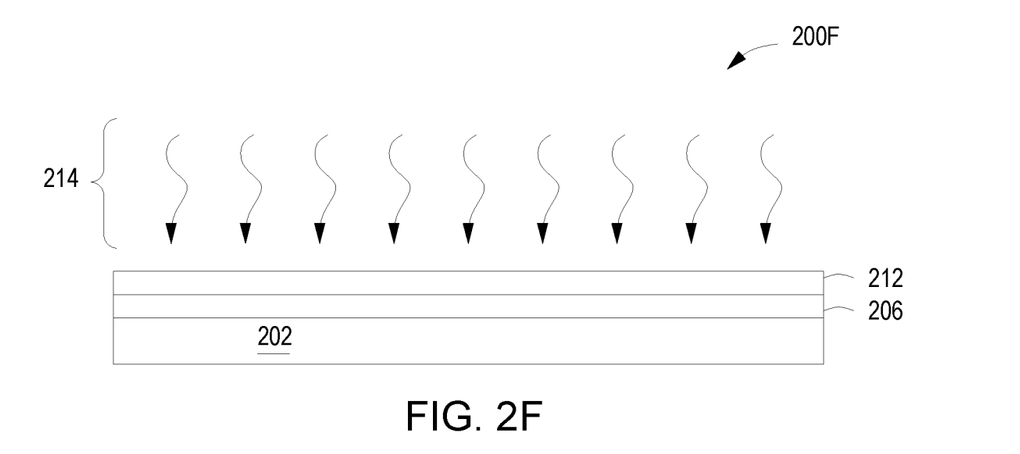

When the thermal soaking is performed, the time duration may vary or may be approximately the same. In some embodiments, the thermal soaking may have a time duration of approximately 100 milliseconds to approximately 10 seconds. The thermal soaking increases the growth, resistivity, and crystallinity of the second layer 212. After thermally soaking the second layer 212, a purging process may be optionally performed to remove the hydrogen-based precursor 214 and/or any non-adsorbed molecules from the substrate 202 before the substrate 202 is removed or before any additional subsequent processing of the substrate 202 (flow chart block 116 of FIG. 1). The purging process may include flowing inert gas over the substrate 202 and/or pumping away any gases in proximity of the substrate 202.

The above blocks of the method 100 may be optionally repeated in some embodiments until a criteria is met (flow chart block 118 of FIG. 1). For example, the method 100 may be repeated until a certain film thickness is achieved or a certain selectivity ratio (such as, for example, Si:SiO$_2$>3:1 for TiSi$_x$) is achieved and the like. Some of the blocks of the method 100 may not be performed in some embodiments of the present principles. The blocks of the method 100 may also be performed more than once and/or in different order in some embodiments of the present principles. By performing the method 100 more than once for silicon-based species such as, for example, TiSi$_x$, an Si:SiO$_2$ selectivity ratio of greater than 5:1 can be achieved. In some embodiments, for example TiSi$_x$ based embodiments, further repetitions of the method 100 may achieve higher selectivity ratios of Si:SiO$_2$ of approximately 10:1 to approximately 20:1. In some embodiments, the selectivity ratio may be approximately 15:1.

Figure 3:
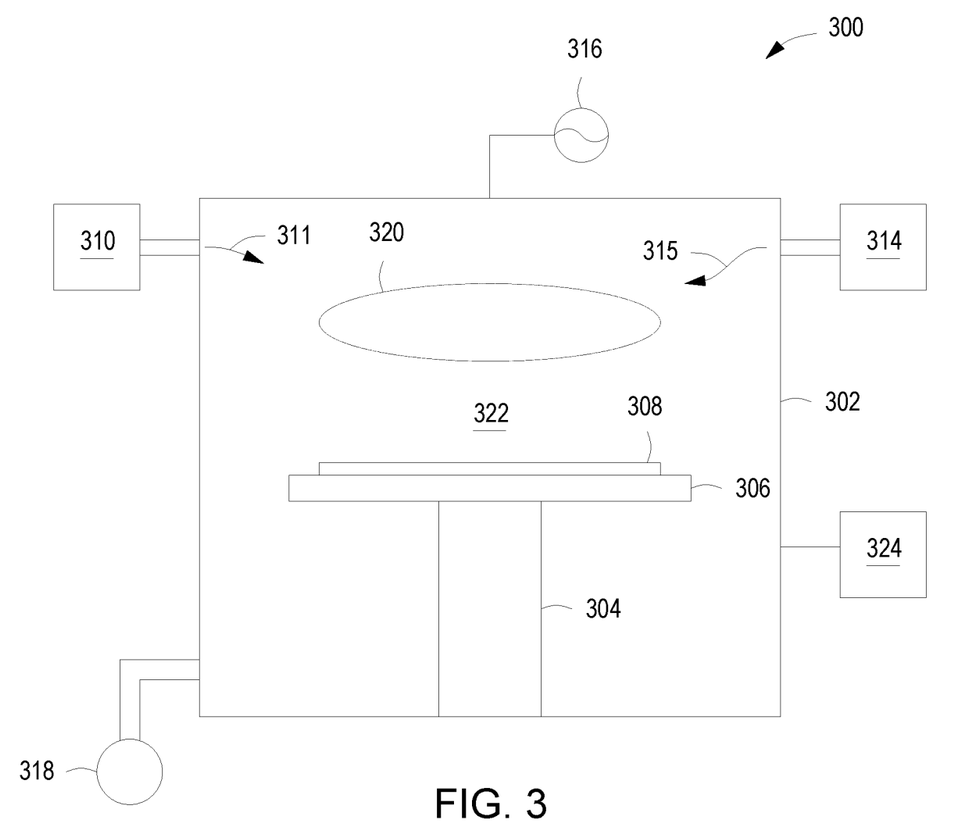
FIG. 3 depicts a representative semiconductor process chamber in accordance with some embodiments of the present principles.

FIG. 3 illustrates a process chamber 300 in accordance with some embodiments of the present principles. The process chamber 300 has a chamber body 302 with a processing volume 322. A substrate 308 rests on a substrate support 306 which is held up by a pedestal 304. During plasma enhanced deposition, a process gas mixture 311 is flowed from a process gas source 310 which, in some embodiments, provides a gas mixture of a chloride-based gas with a hydrogen gas ($H_2$) and an inert gas. In some embodiments, the inert gas is argon. The process gas mixture 311 and the inert gas may be premixed before flowing or mixed during flowing (e.g., gases separated until entering the chamber body 302).

The process gas mixture 311 may be ignited into a plasma 320 by using RF power from an RF power source 316 for some embodiments. The plasma 320 interacts with the substrate 308 in the processing volume 322. After deposition, the processing volume is purged by pump 318 to remove deposition gases and molecules. The purging process may include flowing an inert gas. A hydrogen-based precursor 315 is then flowed into the processing volume 322 from a precursor source 314. A thermal soak is performed on the substrate 308 with the hydrogen-based precursor 315. A temperature controller 324 maintains an approximately common temperature within the process chamber 300 during the deposition and thermal soak processes.

The hydrogen-based precursor 315 is then purged from the processing volume 322 by the pump 318. The purging process may include flowing an inert gas. The processes can then be repeated in the process chamber 300 until a certain film thickness is achieved and/or a certain selectivity ratio is achieved. In some embodiments, the plasma 320 is not used after the first deposition. In some embodiments, different precursors are used in subsequent thermal soak processes.

The process chamber 300 is representative and may be a plasma enhanced atomic layer deposition (PEALD) chamber or a plasma enhanced chemical vapor deposition (PECVD) chamber and the like. The ability to use a single chamber with the above described methods reduces processing time, consumable materials, and complexity during semiconductor manufacturing.

While the foregoing is directed to embodiments of the present principles, other and further embodiments of the principles may be devised without departing from the basic scope thereof.

The invention claimed is:

1. A method for forming a film on a substrate, comprising:
depositing a film on the substrate with a process temperature of less than 500 degrees Celsius, by:
forming a first layer on the substrate using a plasma enhanced process and first gases of a chloride-based gas, a hydrogen gas, and an inert gas;
thermally soaking the first layer with at least a first hydrogen-based precursor gas;
forming a second layer on the first layer without using a plasma enhanced process and using second gases of a chloride-based gas, a hydrogen gas and an inert gas; and
thermally soaking the second layer with at least a second hydrogen-based precursor gas.

2. The method of claim 1, further comprising:
powering the plasma enhanced process with less than approximately 0.283 watts/$cm^2$.

3. The method of claim 1, further comprising:
powering the plasma enhanced process with less than approximately 0.141 watts/$cm^2$.

4. The method of claim 1,
wherein said thermally soaking the first layer and/or said thermally soaking the second layer being performed for a time duration of approximately 100 milliseconds to approximately 10 seconds.

5. The method of claim 1, wherein the inert gas is argon.

6. The method of claim 1, wherein the plasma enhanced process is one of a plasma enhanced atomic layer deposition process and a plasma enhanced chemical vapor deposition process.

7. The method of claim 1,
wherein depositing the film being performed at a pressure of approximately 1 mTorr to approximately 100 Torr.

8. The method of claim 7, wherein depositing the film occurs at a pressure of approximately 50 Torr.

9. The method of claim 1, further comprising:
repeating depositing the film until a certain thickness is achieved on the substrate.

10. A method for forming a film on a substrate in a semiconductor process chamber, comprising:
depositing a film on the substrate, by:
forming a first layer on the substrate using a plasma enhanced process and first gases of a chloride-based gas, a hydrogen gas, and an inert gas;
purging gases from the semiconductor process chamber;
thermally soaking the first layer with at least a first hydrogen-based precursor gas for a time duration of approximately 100 milliseconds to approximately 10 seconds;
purging gases from the semiconductor process chamber;
forming as second layer on the first layer using second gases of a chloride-based gas, a hydrogen gas and an inert gas, the second layer being formed without using a plasma enhanced process;
thermally soaking the second layer with at least a second hydrogen-based precursor gas; and
repeating the depositing of the film until a certain thickness is achieved on the substrate.

11. The method of claim 10,
wherein the plasma enhanced process being performed using power with less than approximately 0.283 watts/$cm^2$.

12. The method of claim 10,
wherein the plasma enhanced process being performed using power with less than approximately 0.141 watts/$cm^2$.

13. The method of claim 10,
wherein said thermally soaking the first layer and/or said thermally soaking the second layer being performed for a time duration of approximately 100 milliseconds to approximately 10 seconds.

14. The method of claim 10, wherein the plasma enhanced process is one of a plasma enhanced atomic layer deposition process and a plasma enhanced chemical vapor deposition process.

15. The method of claim 10,
wherein depositing the film being performed at a pressure of approximately 1 mTorr to approximately 100 Torr.

16. The method of claim 10, wherein depositing the film occurs at a pressure of approximately 50 Torr.

17. A method for forming a film on a substrate in a semiconductor process chamber, comprising:
depositing a film on the substrate, by:
forming a first layer on the substrate using a plasma enhanced process with a power density of less than approximately 0.283 watts/$cm^2$ and first gases of a chloride-based gas, a hydrogen gas, and an inert gas;
purging gases from the semiconductor process chamber;
thermally soaking the first layer with at least a first hydrogen-based precursor gas;

purging gases from the semiconductor process chamber; and forming a subsequent layer on the first layer without using a plasma enhanced process; and thermally soaking the subsequent layer with at least a second hydrogen-based precursor gas.

* * * * *